(12) United States Patent
Chong

(10) Patent No.: US 11,817,535 B2
(45) Date of Patent: Nov. 14, 2023

(54) LIGHT EMITTING DIODE STRUCTURE AND METHOD FOR MANUFACTURING THE SAME

(71) Applicant: Raysolve Optoelectronics (Suzhou) Company Limited, Suzhou (CN)

(72) Inventor: Wing Cheung Chong, Hong Kong (CN)

(73) Assignee: RAYSOLVE OPTOELECTRONICS (SUZHOU) COMPANY LIMITED, Suzhou (CN)

( * ) Notice: Subject to any disclaimer, the term of this patent is extended or adjusted under 35 U.S.C. 154(b) by 267 days.

(21) Appl. No.: 17/228,786

(22) Filed: Apr. 13, 2021

(65) Prior Publication Data

US 2021/0328121 A1   Oct. 21, 2021

Related U.S. Application Data

(60) Provisional application No. 63/013,172, filed on Apr. 21, 2020.

(51) Int. Cl.
*H01L 33/62* (2010.01)
*G09G 3/32* (2016.01)
(Continued)

(52) U.S. Cl.
CPC .............. *H01L 33/62* (2013.01); *G09G 3/32* (2013.01); *H01L 33/005* (2013.01); *H01L 33/04* (2013.01);
(Continued)

(58) Field of Classification Search
CPC ....... H01L 33/62; H01L 33/005; H01L 33/04; H01L 33/56; H01L 2933/0066;
(Continued)

(56) References Cited

U.S. PATENT DOCUMENTS 10,177,127 B2   1/2019   Zhang et al.
2003/0189215 A1   10/2003   Jong-Lam et al.
(Continued)

FOREIGN PATENT DOCUMENTS

CN   102231378 A   11/2011
CN   102479896 A   5/2012
(Continued)

OTHER PUBLICATIONS

Examination Opinion Notice in corresponding Chinese Application No. 202110456652.6 dated May 23, 2022 (10 pages).
(Continued)

*Primary Examiner* — Victor A Mandala
(74) *Attorney, Agent, or Firm* — Bayes PLLC

(57) ABSTRACT

A LED structure includes a substrate, a plurality of LED units, a bonding layer and a metal contact. The substrate includes a driving circuit, and a plurality of LED units is formed on the substrate. The bonding layer is formed between the substrate and the plurality of LED units, and the metal contact is formed in the bonding layer beneath each LED unit to electrically connect each LED unit with a contact pad of the driving circuit. A first sectional area of the metal contact is smaller than a second sectional area of each LED unit.

15 Claims, 14 Drawing Sheets

(51) Int. Cl.
*H01L 33/00* (2010.01)
*H01L 33/56* (2010.01)
*H01L 33/04* (2010.01)

(52) U.S. Cl.
CPC ...... *H01L 33/56* (2013.01); *H01L 2933/0066* (2013.01)

(58) Field of Classification Search
CPC ..... H01L 25/167; H01L 27/156; H01L 33/06; G09G 3/32
See application file for complete search history.

(56) References Cited

U.S. PATENT DOCUMENTS

| | | | |
|---|---|---|---|
| 2012/0112215 A1* | 5/2012 | Chai | H01L 33/62 257/89 |
| 2012/0112220 A1* | 5/2012 | West | H01L 33/62 257/E33.072 |
| 2017/0170152 A1* | 6/2017 | Wi | H01L 33/56 |
| 2017/0207249 A1* | 7/2017 | Rhee | H01L 27/1248 |
| 2019/0051792 A1 | 2/2019 | Lo et al. | |
| 2019/0088633 A1 | 3/2019 | Tao et al. | |
| 2019/0115334 A1 | 4/2019 | Zhang et al. | |
| 2019/0280157 A1* | 9/2019 | Hu | H01L 33/46 |
| 2019/0295996 A1* | 9/2019 | Park | H01L 33/502 |
| 2019/0392751 A1* | 12/2019 | Hsieh | G09G 3/32 |
| 2020/0235077 A1* | 7/2020 | Jeon | H01L 22/12 |

FOREIGN PATENT DOCUMENTS

| | | |
|---|---|---|
| CN | 109841715 B | 6/2019 |
| CN | 110634905 A | 12/2019 |
| CN | 112531091 A | 3/2021 |
| WO | 2020163436 A1 | 8/2020 |

OTHER PUBLICATIONS

International Search Report and Written Opinion in corresponding PCT Application No. PCT/CN2021/089870, dated Jan. 14, 2022 (8 pages).
Office Action in corresponding Chinese Application No. 202110456652.6 dated Aug. 5, 2022 (18 pages).

* cited by examiner

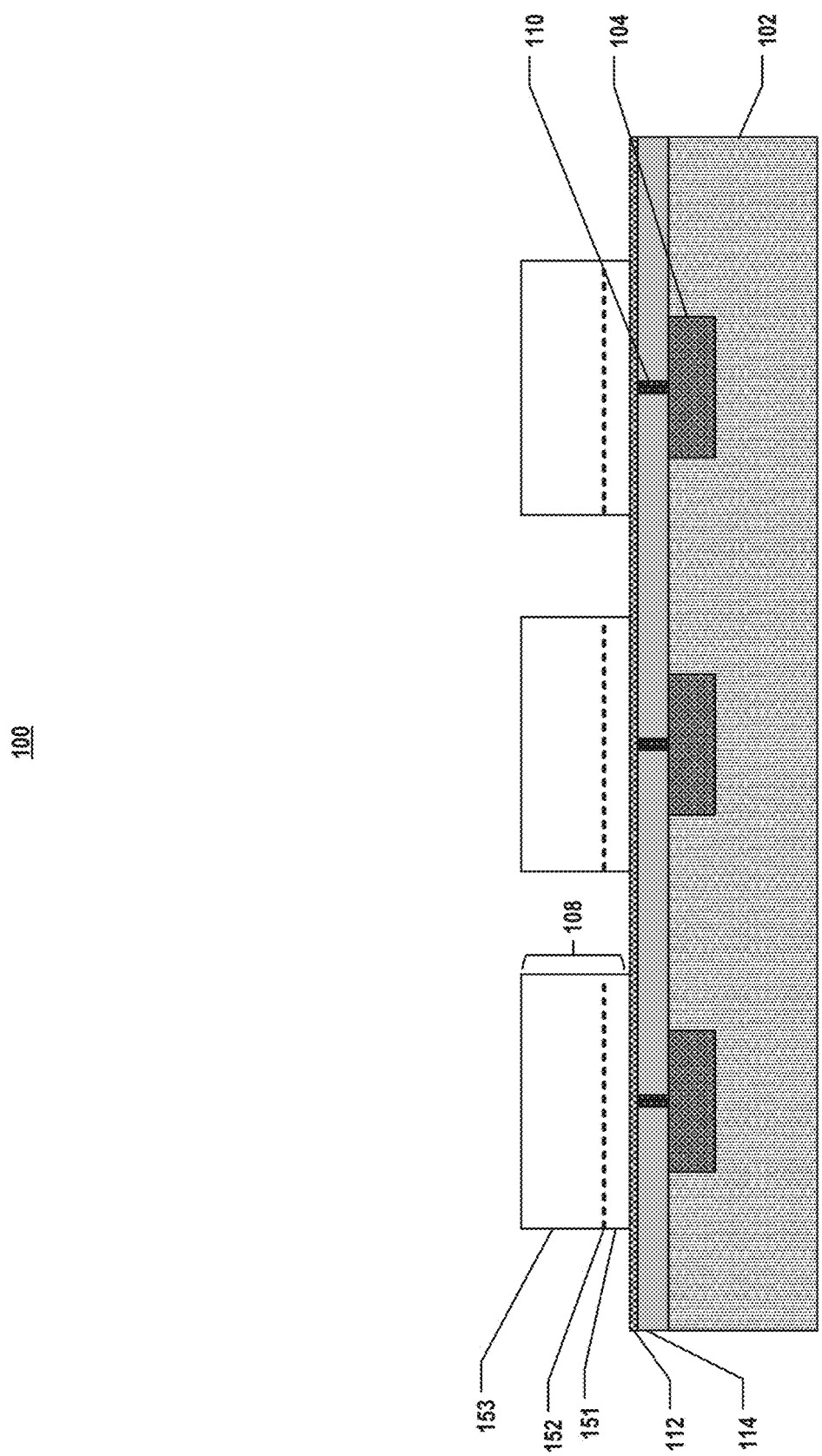

400

```
┌─────────────────────────────────────────────────────────────┐
│ Forming a driving circuit having a plurality of contact pads │
│ in a first substrate                                         │
└─────────────────────────────────────────────────────────────┘ — 402
                              │
                              ▼
┌─────────────────────────────────────────────────────────────┐
│ Forming a plurality of metal contacts on the first substrate,│
│ each metal contact being located on one of the plurality of  │
│ contact pads                                                 │
└─────────────────────────────────────────────────────────────┘ — 404
                              │
                              ▼
┌─────────────────────────────────────────────────────────────┐
│ Forming a nonconductive adhesive layer on the first substrate│
│ covering the plurality of contact pads and the plurality of  │
│ metal contacts                                               │
└─────────────────────────────────────────────────────────────┘ — 406
                              │
                              ▼
┌─────────────────────────────────────────────────────────────┐
│ Forming a plurality of LED units on the nonconductive        │
│ adhesive layer                                               │
└─────────────────────────────────────────────────────────────┘ — 408
```

FIG. 4

LIGHT EMITTING DIODE STRUCTURE AND METHOD FOR MANUFACTURING THE SAME

CROSS-REFERENCE TO RELATED APPLICATION

This application claims the benefit of priority of U.S. Provisional Application No. 63/013,172, filed on Apr. 21, 2020, entitled "Method for integration of Micro-LEDs and display driver," the content of which is incorporated herein by reference in its entirety.

TECHNICAL FIELD

The present disclosure relates to a light emitting diode (LED) structure and a method for manufacturing the LED structure, and more particularly, to a LED structure with a plurality of individually functionable LED units bonding to driving circuits with nonconductive adhesive layer and the method for manufacturing the same.

BACKGROUND

In the recent years, LEDs have become popular in lighting applications. As light sources, LEDs have many advantages including higher light efficiency, lower energy consumption, longer lifetime, smaller size, and faster switching.

Displays having micro-scale LEDs are known as micro-LED. Micro-LED displays have arrays of micro-LEDs forming the individual pixel elements. A pixel may be a minute area of illumination on a display screen, one of many from which an image is composed. In other words, pixels may be small discrete elements that together constitute an image on a display. Pixels are normally arranged in a two-dimensional (2D) matrix, and are represented using dots, squares, rectangles, or other shapes. Pixels may be the basic building blocks of a display or digital image and with geometric coordinates.

When manufacturing the micro-LEDs, the LED units are bonded to the driving circuits through a eutectic bonding process. The bonding material used in the eutectic bonding process generally includes thick precious metals, e.g., gold, platinum or indium, and the cost of the eutectic bonding process remains high because of the use of precious metals. Further, the eutectic bonding process requires a high temperature to bond the LED units with the driving circuits, and the temperature may cause an internal stress because of the thermal mismatch between the semiconductor layers forming the LED units and the driving circuits.

Embodiments of the disclosure address at least the above problems by providing a LED structure using a nonconductive adhesive layer to bond the LED units and the driving circuits and the method for manufacturing the same.

SUMMARY

Embodiments of the LED structure and method for forming the LED structure are disclosed herein.

In one example, a LED structure is disclosed. The LED structure includes a substrate, a plurality of LED units, a bonding layer and a metal contact. The substrate includes a driving circuit, and a plurality of LED units is formed on the substrate. The bonding layer is formed between the substrate and the plurality of LED units, and the metal contact is formed in the bonding layer beneath each LED unit to electrically connect each LED unit with a contact pad of the driving circuit. A first sectional area of the metal contact is smaller than a second sectional area of each LED unit.

In another example, a LED structure is disclosed. The LED structure includes a substrate, a plurality of LED units and a nonconductive adhesive layer. The substrate includes a driving circuit, and a plurality of LED units is formed on the substrate. The nonconductive adhesive layer bonds the substrate and the plurality of LED units. The nonconductive adhesive layer is embedded with a metal contact therein, and the metal contact and a portion of the nonconductive adhesive layer are integrally formed beneath each LED unit.

In a further example, a method for manufacturing a LED structure is disclosed. A driving circuit having a plurality of contact pads is formed in a first substrate. A plurality of metal contacts are formed on the first substrate, and each metal contact is located on one of the plurality of contact pads. A nonconductive adhesive layer is formed on the first substrate covering the plurality of contact pads and the plurality of metal contacts. A plurality of LED units are formed on the nonconductive adhesive layer. Each LED unit is electrically connected to one of the plurality of contact pads through one of the plurality of metal contacts.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

FIGS. 2A-2I illustrate cross sections of an exemplary LED structure at different stages of a manufacturing process, according to some implementations of the present disclosure.

FIG. 4 is a flowchart of an exemplary method for manufacturing a LED structure, according to some implementations of the present disclosure.

Figure 1A:
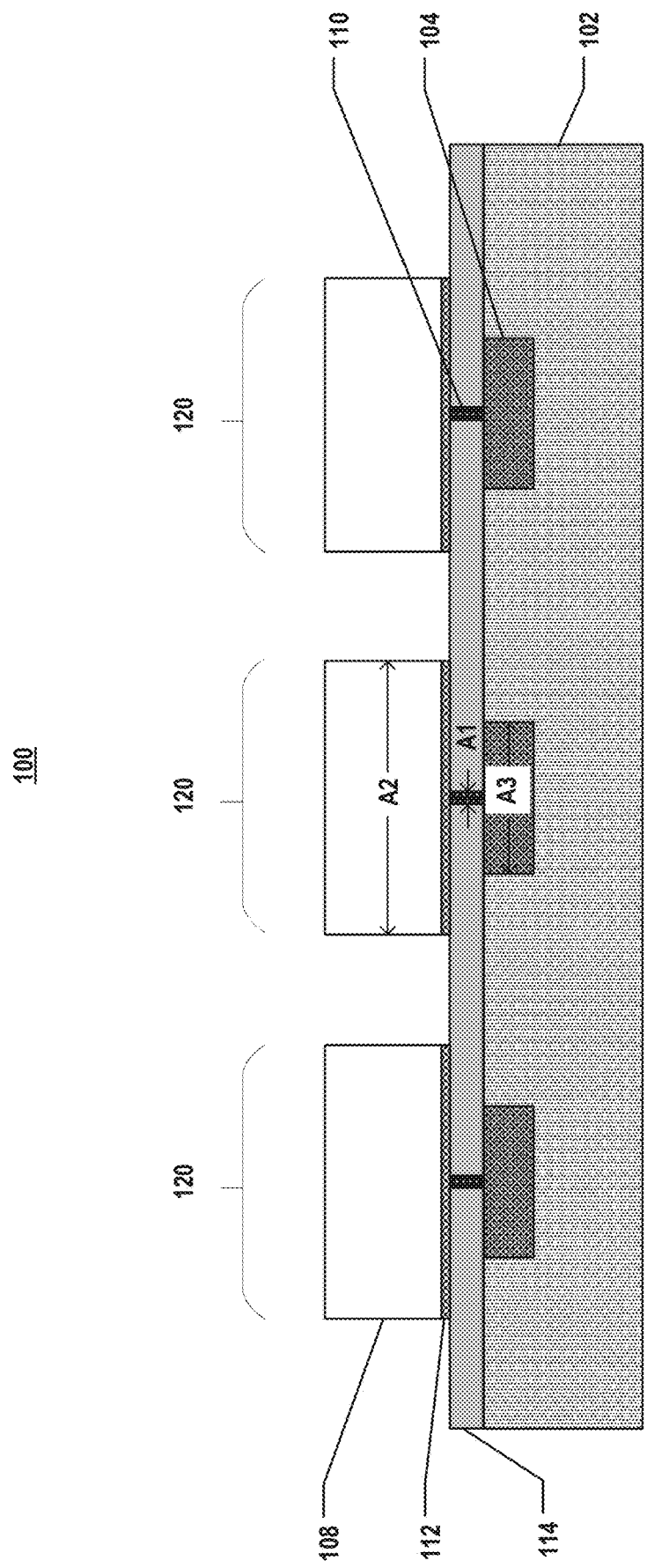
FIGS. 1A-1B illustrate cross sections of an exemplary LED structure, according to some implementations of the present disclosure.

Implementations of the present disclosure w % ill be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense.

Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, a semiconductor layer can include one or more doped or undoped semiconductor layers and may have the same or different materials.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, silicon carbide, gallium nitride, germanium, gallium arsenide, indium phosphide, etc. Alternatively, the substrate can be made from an electrically non-conductive material, such as a glass, a plastic, or a sapphire wafer. Further alternatively, the substrate can have semiconductor devices or circuits formed therein.

As used herein, the term "micro" LED, "micro" p-n diode or "micro" device refers to the descriptive size of certain devices or structures according to implementations of the invention. As used herein, the terms "micro" devices or structures are meant to refer to the scale of 0.1 to 100 μm. However, it is to be appreciated that implementations of the present invention are not necessarily so limited, and that certain aspects of the implementations may be applicable to larger, and possibly smaller size scales.

Implementations of the present invention describe LED structure or micro-LED structure and a method for manufacturing the structure. For manufacturing a micro-LED display, an epitaxy layer is bonded to a receiving substrate. The receiving substrate, for example, may be, but is not limited to, a display substrate including CMOS backplane or TFT glass substrate. Then the epitaxy layer is formed with an array of micro-LEDs on the receiving substrate. The CMOS backplane or TFT glass substrate forms the driving circuits to drive the micro-LED structure, and the epitaxy layer includes LED units or functional mesas to actively illuminate light. When forming the LED structure or micro-LED structure, an adhesive material is used to bond the epitaxy layer on the receiving substrate. The present disclosure introduces the LED structures and the methods for manufacturing the LED structures that using a nonconductive adhesive layer to bond the LED units and the driving circuits.

FIG. 1A illustrates a cross-section view of a LED structure 100, according to some implementations of the present disclosure. LED structure 100 includes a substrate 102 having a driving circuit, and the driving circuit includes a plurality of contact pads 104. LED structure 100 also includes a plurality of LED units 120 formed on substrate 102. A bonding layer 114 is formed between substrate 102 and LED units 120. A metal contact 110 is formed in bonding layer 114 beneath each LED unit 120 to electrically connect each LED unit 120 with contact pad 104 of the driving circuit. The metal contact 110, each LED unit 120, and the contact pad 104, have their own sectional areas, denoted with A1, A2, and A3, respectively. Consistent with the present disclosure, the sectional area A1 of metal contact 110 (the "first sectional area") is smaller than the sectional area A2 of each LED unit 120 (the "second sectional area"). As shown in FIG. 1A, the sectional area A1 of metal contact 110 is also smaller than the sectional area A3 of the contact pad 104 (the "third sectional area"). However, it is contemplated that in some alternative implementations, the sectional area A1 of metal contact 110 may be equal to or larger than the sectional area A3 of the contact pad 104. Because LED units 120 and contact pads 104 are mainly bonded by bonding layer 114, and metal contacts 110 only occupies a small part between LED units 120 and contact pads 104, the using of precious metals could be largely reduced and therefore the manufacturing cost could be lowered.

In some implementations, first substrate 102 may include a semiconductor material, such as silicon, silicon carbide, gallium nitride, germanium, gallium arsenide, indium phosphide. In some implementations, first substrate 102 may be made from an electrically non-conductive material, such as a glass, a plastic or a sapphire wafer. In some implementations, first substrate 102 may have driving circuits formed therein. In some embodiments, first substrate 102 may be a CMOS backplane or TFT glass substrate. The driving circuit provides the electronic signals to LED units 120 to control the luminance. In some implementations, the driving circuit may include an active matrix driving circuit, in which each independent driver corresponds to an individual LED unit 120. In some implementations, the driving circuit may include a passive matrix driving circuit, in which the data lines and the scan lines driven by the driving circuit may be connected to a plurality of LED units 120 aligned in an array.

The plurality of LED units 120 are bonded with first substrate 102 through bonding layer 114. Bonding layer 114 is a layer of an adhesive material formed on first substrate 102 to bond first substrate 102 and LED units 120. In some implementations, bonding layer 114 may include a nonconductive material, such as polyimide (PI), polydimethylsiloxane (PDMS), SU-8 photoresist, polymethylglutarimide (PMGI), non-conductive film (NCF) or other suitable material. It is understood that the descriptions of the material of bonding layer 114 are merely illustrative and are not limited to the examples listed, and those skilled in the art can appreciate other suitable materials can be used according to requirements, all of which are within the scope of the present application.

As shown in FIG. 1A, bonding layer 114 under each LED unit 120 extends to bonding layer 114 under adjacent LED unit 120. Hence, the bonding strength between substrate 102 and the plurality of LED units 120 may be strengthened and the risk of peeling-off of LED structure 100 can be reduced.

Metal contact 110 is formed in bonding layer 114 to electrically connect each LED unit 120 with contact pad 104. In some implementations, metal contact 110 may include gold (Au), platinum (Pt), chromium (Cr), aluminum (Al), nickel (Ni), titanium (Ti), or other suitable material. The dimensions of metal contact 110 may be selected according to certain criteria. The sectional area of metal contact 110 should be significantly small than the sectional area of bonding layer 114, so that the benefit of using nonconductive materials to bond LED units 120 and contact pads 104, such as lowering the manufacturing cost, higher bond yield and reducing the internal stress, could be obtained. On the other hand, the sectional area of metal contact 110 should be sufficient to provide an electric path between LED units 120 and contact pads 104 to provide the control signal signals to LED units 120. In some implementations, a diameter of the sectional area of metal contact 110 is less than about 1 micrometer. In some other implementations, a diameter of the sectional area of metal contact 110 is between about 0.5 micrometer and about 1 micrometer. In some implementations, a thickness of metal contact 110 is less than about 1 micrometer.

Figure 1B:
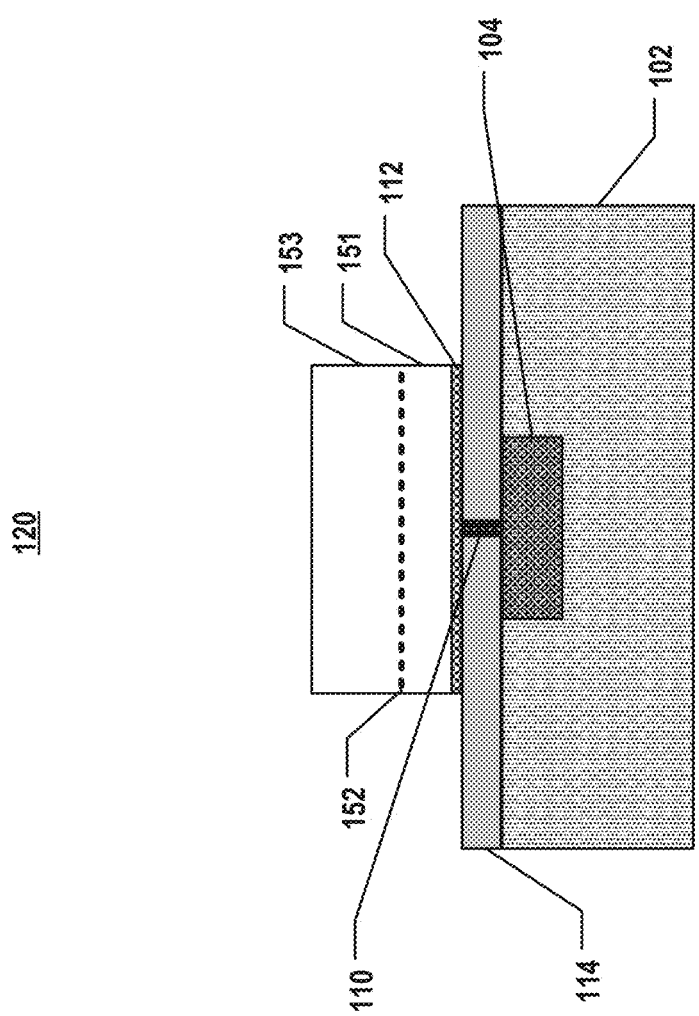

FIG. 1B illustrates a cross-section view of one LED unit 120 of LED structure 100, according to some implementations of the present disclosure. LED unit 120 includes an ohmic contact layer 112, a first doping type semiconductor layer 151, a multiple quantum well (MQW) layer 152, and a second doping type semiconductor layer 153. Ohmic contact layer 112 is formed on bonding layer 114 and metal contact 110. In some implementations, ohmic contact layer 112 includes a conductive material. For example, ohmic contact layer 112 may include Indium tin oxide (ITO), silver (Ag), Al, Au, or other suitable material.

First doping type semiconductor layer 151 is formed on ohmic contact layer 112. In some implementations, first doping type semiconductor layer 151 and second doping type semiconductor layer 153 may include one or more layers based on II-VI materials, such as ZnSe or ZnO, or III-V nitride materials, such as GaN, AlN, InN, InGaN, GaP, AlInGaP, AlGaAs, and their alloys.

In some implementations, first doping type semiconductor layer 151 may be a p-type semiconductor layer and forms an anode of LED units 120. For example, first doping type semiconductor layer 151 may be p-type GaN. As another example, first doping type semiconductor layer 151 may be p-type InGaN. As yet another example, first doping type semiconductor layer 151 may be p-type AlInGaP.

In some implementations, second doping type semiconductor layer 153 may be a n-type semiconductor layer and form a cathode of LED unit 120. For example, second doping type semiconductor layer 153 may be n-type GaN. As another example, second doping type semiconductor layer 153 may be n-type InGaN. As yet another example, second doping type semiconductor layer 153 may be n-type AlInGaP.

LED unit 120 further includes MQW layer 152 formed between first doping type semiconductor layer 151 and second doping type semiconductor layer 153. MQW layer 152 is the active region of LED unit 120. In some implementations, the thickness including first doping type semiconductor layer 151, MQW layer 152 and second doping type semiconductor layer 153 may be between about 0.3 μm and about 5 μm. In some other implementations, the thickness including first doping type semiconductor layer 151, MQW layer 152 and second doping type semiconductor layer 153 may be between about 0.4 μm and about 4 μm. In some alternative implementations, the thickness including first doping type semiconductor layer 151, MQW layer 152 and second doping type semiconductor layer 153 may be between about 0.5 μm and about 3 μm.

LED unit 120 has an anode and a cathode connected to the driving circuit formed in substrate 102 (driving circuit not explicitly shown). For example, LED unit 120 has the anode connected to a source/drain electrode of the driving circuit through metal contact 110 and contact pad 104. LED unit 120 also has the cathode connected to a constant voltage source. In some implementations, the cathode of the plurality of LED units 120 may be connected to the same constant voltage source.

LED unit 120 may further include a passivation layer and an electrode layer (not shown). The passivation layer is formed on second doping type semiconductor layer 153 for protecting and isolating LED unit 120. In some implementations, the passivation layer may include $SiO_2$, $Al_2O_3$, SiN or other suitable materials. In some implementations, the passivation layer may include polyimide, SU-8 photoresist, or other photo-patternable polymer. The electrode layer is formed on a portion of the passivation layer and connects second doping type semiconductor layer 153 through an opening on the passivation layer. In some implementations, the electrode layer of the plurality of LED units 120 may be electrically connected to the same constant voltage source, and the plurality of LED units 120 share a common cathode. By sharing a common cathode, second doping type semiconductor layer 153 of the plurality of LED units 120 may be electrically connected together, and the operation of the plurality of LED units 120 could be controlled by the driving circuit through individually changing the voltage levels of first doping type semiconductor layer 151 of the plurality of LED units 120. In some implementations, the electrode layer may be conductive materials, such as indium tin oxide (ITO), Cr, Ti, Pt, Au, Al, copper (Cu), germanium (Ge), Ni, or other suitable material.

FIGS. 2A-2I illustrate cross sections of LED structure 100 at different stages of a manufacturing process, according to some implementations of the present disclosure. FIG. 4 is a flowchart of a method 400 for manufacturing LED structure 100, according to some implementations of the present disclosure. For the purpose of better explaining the present disclosure, FIGS. 2A-2I and the flowchart in FIG. 4 will be described together.

Figure 2A:
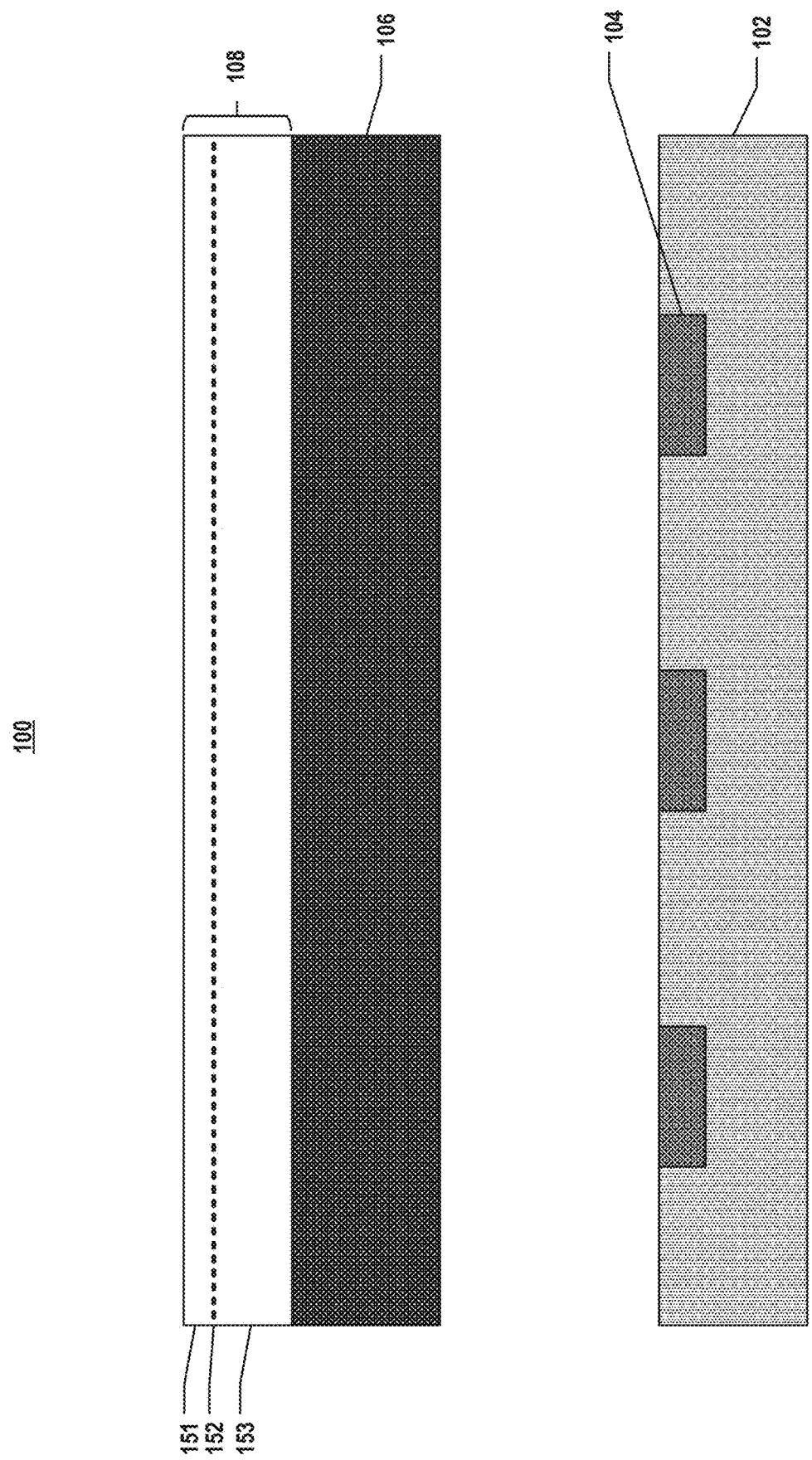

In FIG. 2A and operation 402 of FIG. 4, a driving circuit is formed in first substrate 102 and the driving circuit includes contact pads 104. For example, the driving circuit may include CMOS devices manufactured on a silicon wafer and some wafer-level packaging layers or fan-out structures are stacked on the CMOS devices to form contact pads 104. For another example, the driving circuit may include TFTs manufactured on a glass substrate and some wafer-level packaging layers or fan-out structures are stacked on the TFTs to form contact pads 104. A semiconductor layer 108 is formed on a second substrate 106, and semiconductor layer 108 includes first doping type semiconductor layer 151, second doping type semiconductor layer 153 and MQW layer 152.

In some implementations, first substrate 102 or second substrate 106 may include a semiconductor material, such as silicon, silicon carbide, gallium nitride, germanium, gallium arsenide, indium phosphide. In some implementations, first substrate 102 or second substrate 106 may be made from an electrically non-conductive material, such as a glass, a plastic or a sapphire wafer. In some implementations, first substrate 102 may have driving circuits formed therein, and first substrate 102 may include a CMOS backplane or TFT glass substrate. In some implementations, first doping type semiconductor layer 151 and second doping type semiconductor layer 153 may include one or more layers based on II-VI materials, such as ZnSe or ZnO, or III-V nitride materials, such as GaN, AlN, InN, InGaN, GaP, AlInGaP, AlGaAs, and their alloys. In some implementations, first doping type semiconductor layer 151 may include a p-type semiconductor layer, and second doping type semiconductor layer 153 may include a n-type semiconductor layer.

Figure 2B:
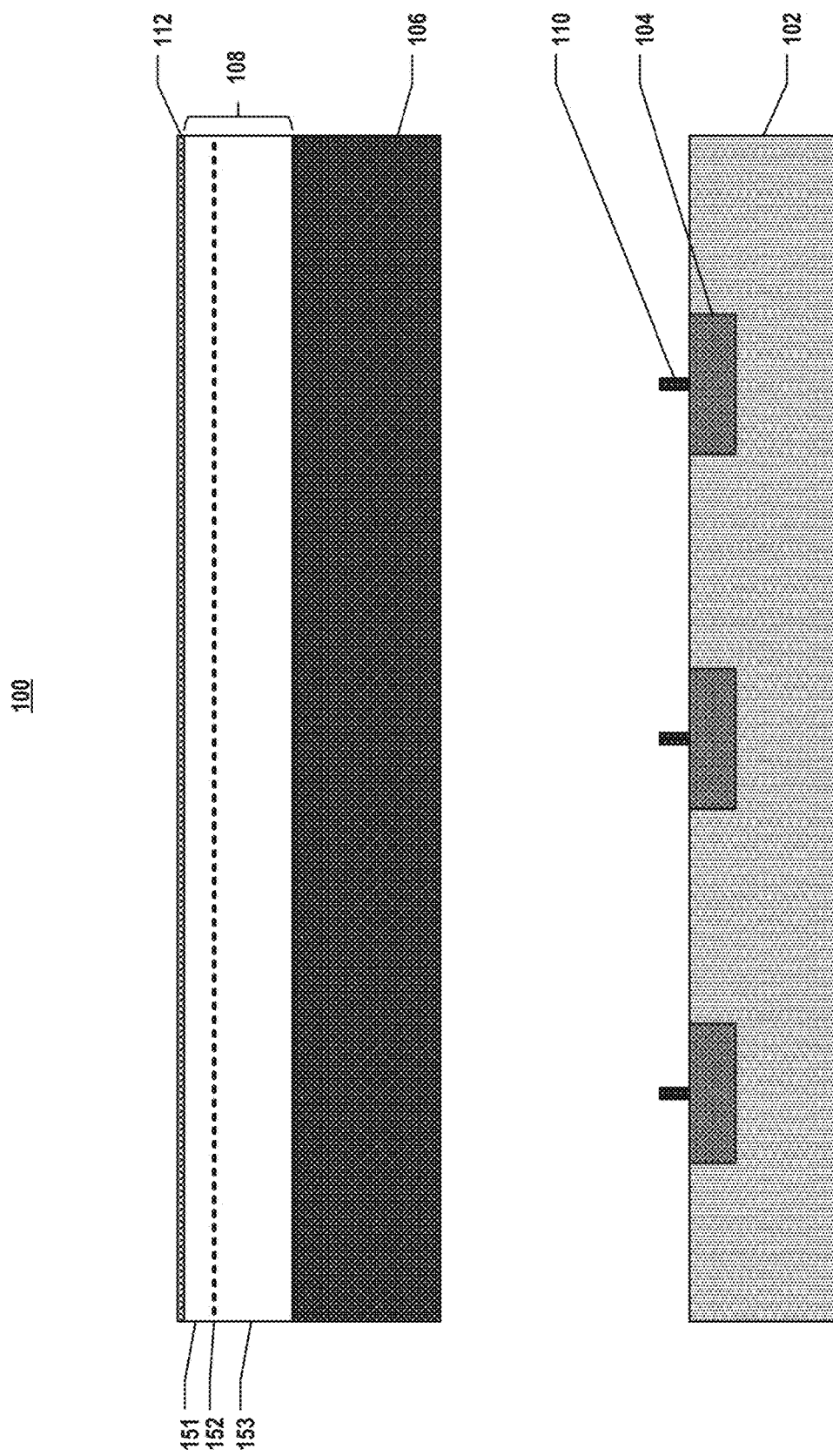

In FIG. 2B and operation 404 of FIG. 4, a plurality of metal contacts 110 are formed on first substrate 102 on each contact pad 104. Each metal contact 110 electrically connects to one contact pad 104 of the driving circuit. In some implementations, metal contact 110 may include Au, Pt, Cr, Al, Ni, Ti, or other suitable material. In some implementations, a diameter of the sectional area of metal contact 110 is less than about 1 micrometer. In some other implementations, a diameter of the sectional area of metal contact 110 is between about 0.5 micrometer and about 1 micrometer. In some implementations, a thickness of metal contact 110 is less than about 1 micrometer.

For forming metal contacts 110, in some implementations, a photoresist layer may be deposited on first substrate 102 covering the plurality of contact pads 104. Then, a photolithography process may be used to form a plurality of openings on each contact pad 104 and expose each contact pad 104. The metal materials, e.g., Au, Pt, Cr, Al, Ni, Ti, or other suitable material, may be formed in the openings by chemical vapor deposition (CVD), physical vapor deposition (PVD), atomic layer deposition (ALD), or other suitable process. Then, the photoresist layer may be removed by an etch or ash process. After removing the photoresist layer, metal contacts 110 are formed on each contact pad 104.

As shown in FIG. 2B, ohmic contact layer 112 is directly formed on first doping type semiconductor layer 151. In some implementations, ohmic contact layer 112 includes a conductive material. In some implementations, ohmic contact layer 112 may include indium tin oxide (ITO), Ag, Al, Au, or other suitable material. Ohmic contact layer 112 provides a junction between two conductors, e.g., metal contacts 110 and first doping type semiconductor layer 151, that has a linear current-voltage curve. Ohmic contact layer 112 has a low resistance to allow charges to flow easily in both directions between metal contacts 110 and first doping type semiconductor layer 151. Ohmic contact layer 112 directly contacts first doping type semiconductor layer 151, which is the anode of LED unit 120, and provides a junction between first doping type semiconductor layer 151 and metal contacts 110. In other words, ohmic contact layer 112 is formed on first doping type semiconductor layer 151 without any layer in between. Hence, after bonding ohmic contact layer 112 with metal contacts 110, ohmic contact layer 112 could provide a linear current-voltage curve between metal contacts 110 and first doping type semiconductor layer 151.

Figure 2C:
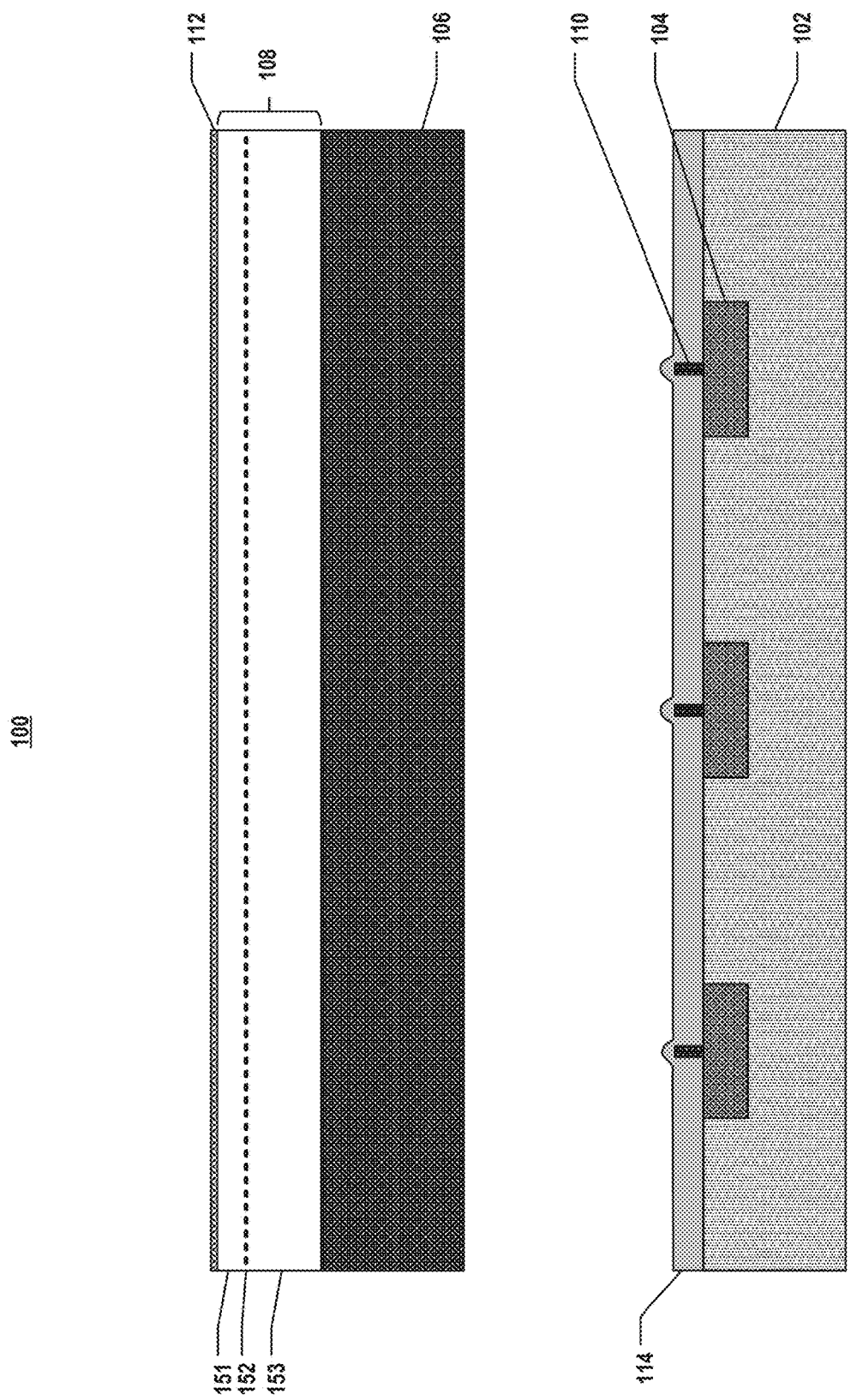

Then, as shown in FIG. 2C and operation 406 of FIG. 4, bonding layer 114 is deposited over first substrate 102, the plurality of contact pads 104, and the plurality of metal contacts 110. Bonding layer 114 includes nonconductive adhesive material. In some implementations, bonding layer 114 may include polyimide (PI), polydimethylsiloxane (PDMS), SU-8 photoresist, polymethylglutarimide (PMGI), non-conductive film, or other suitable material. In some implementations, bonding layer 114 may be deposited over first substrate 102, the plurality of contact pads 104, and the plurality of metal contacts 110 by a spin-coating process, and because of the liquid physical property of bonding layer 114, a thickness of bonding layer 114 on the top of each metal contact 110 is thinner than a thickness of bonding layer 114 on first substrate 102 and contact pads 104.

Figure 2D:
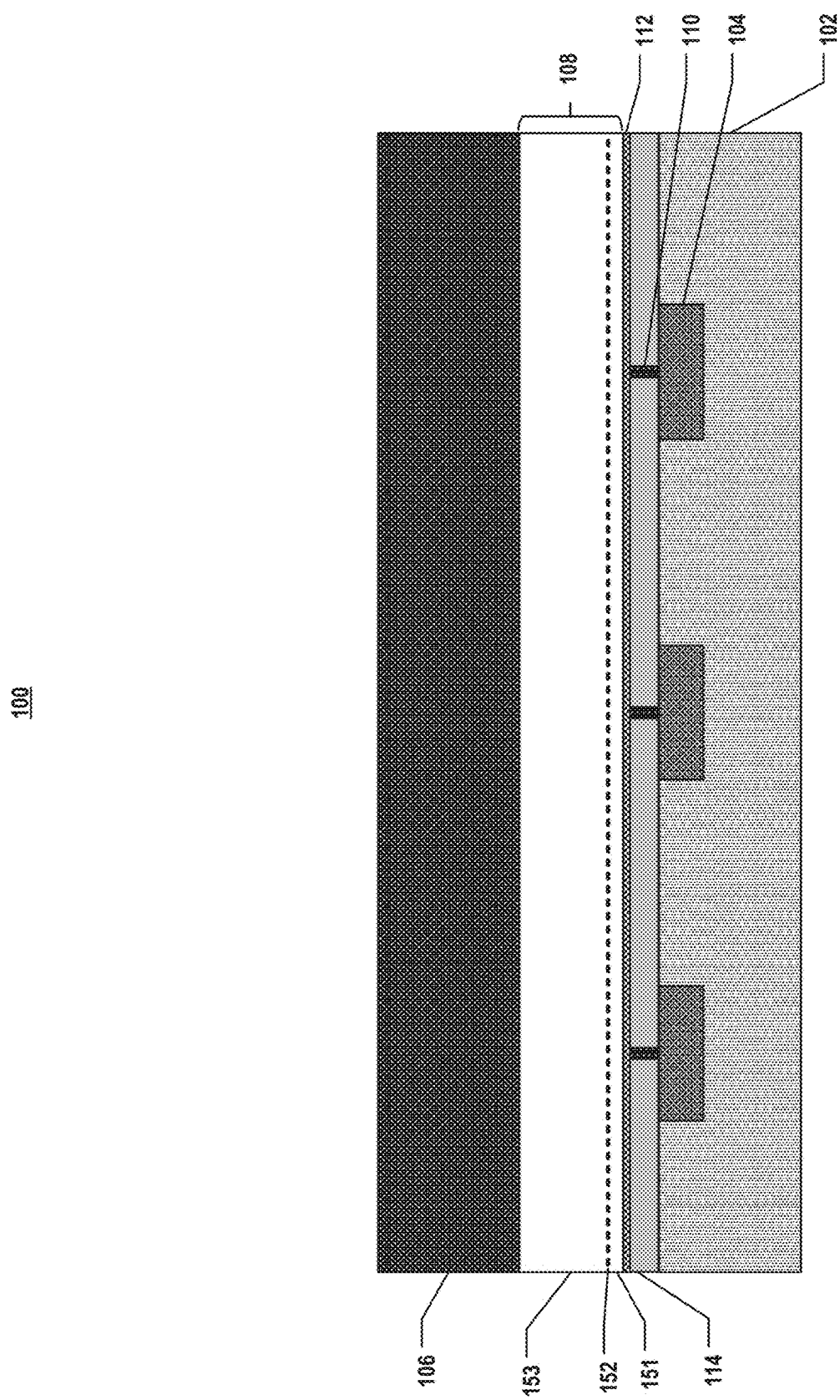

As shown in FIG. 2D, and operation 408 of FIG. 4, second substrate 106, semiconductor layer 108 and ohmic contact layer 112, are flipped over and placed on bonding layer 114. First substrate 102 and second substrate 106 are pressed against each other to bond semiconductor layer 108 and ohmic contact layer 112 with bonding layer 114. Because of the pressure applied on first substrate 102 and second substrate 106, bonding layer 114 deposited on the top of each metal contact 110 may be squeezed or extruded so that metal contacts 110 may electrically contact ohmic contact layer 112.

Figure 3A:
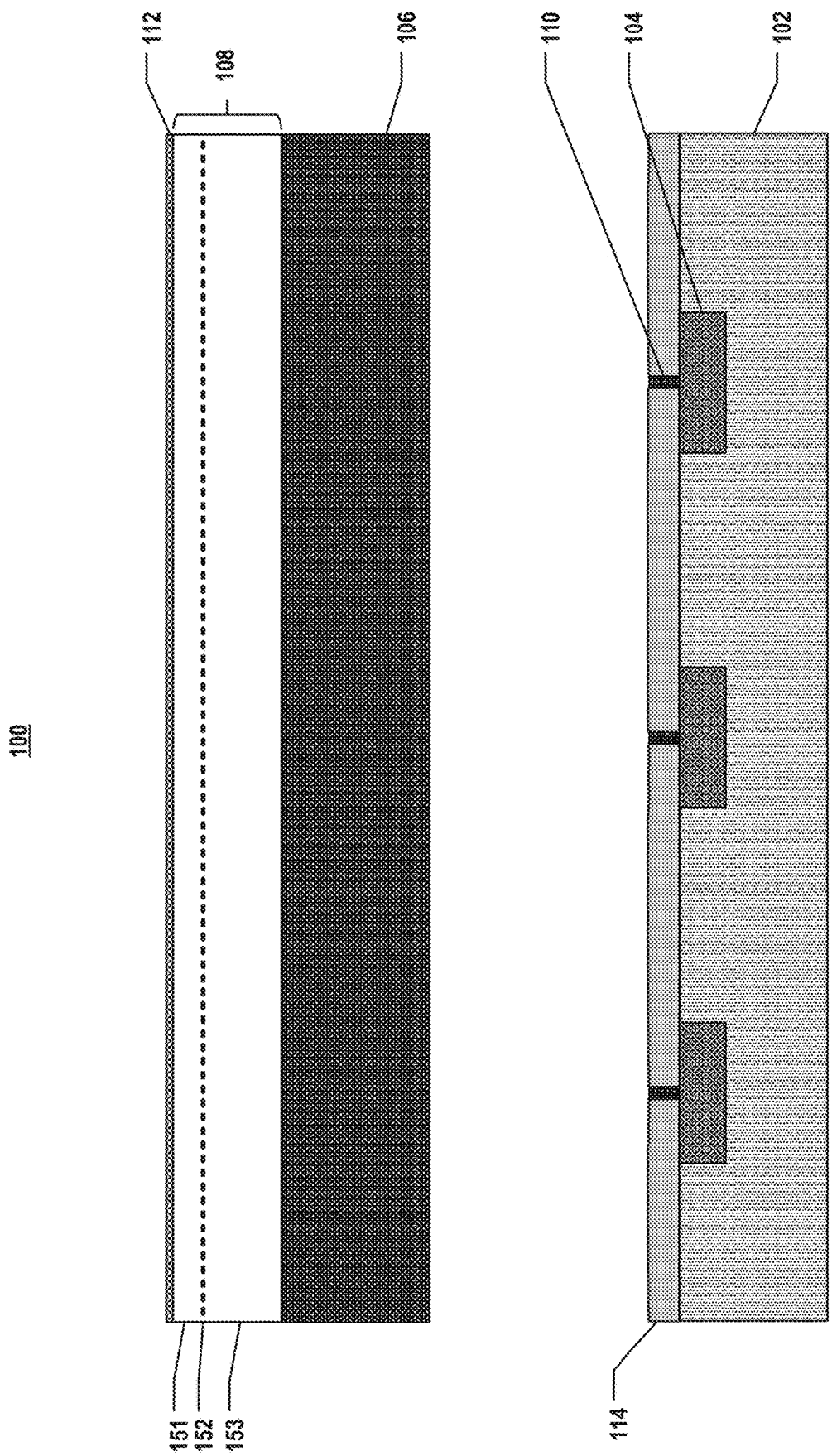
FIGS. 3A-3B illustrate cross sections of another exemplary LED structure at different stages of a manufacturing process, according to some implementations of the present disclosure.
Figure 3B:
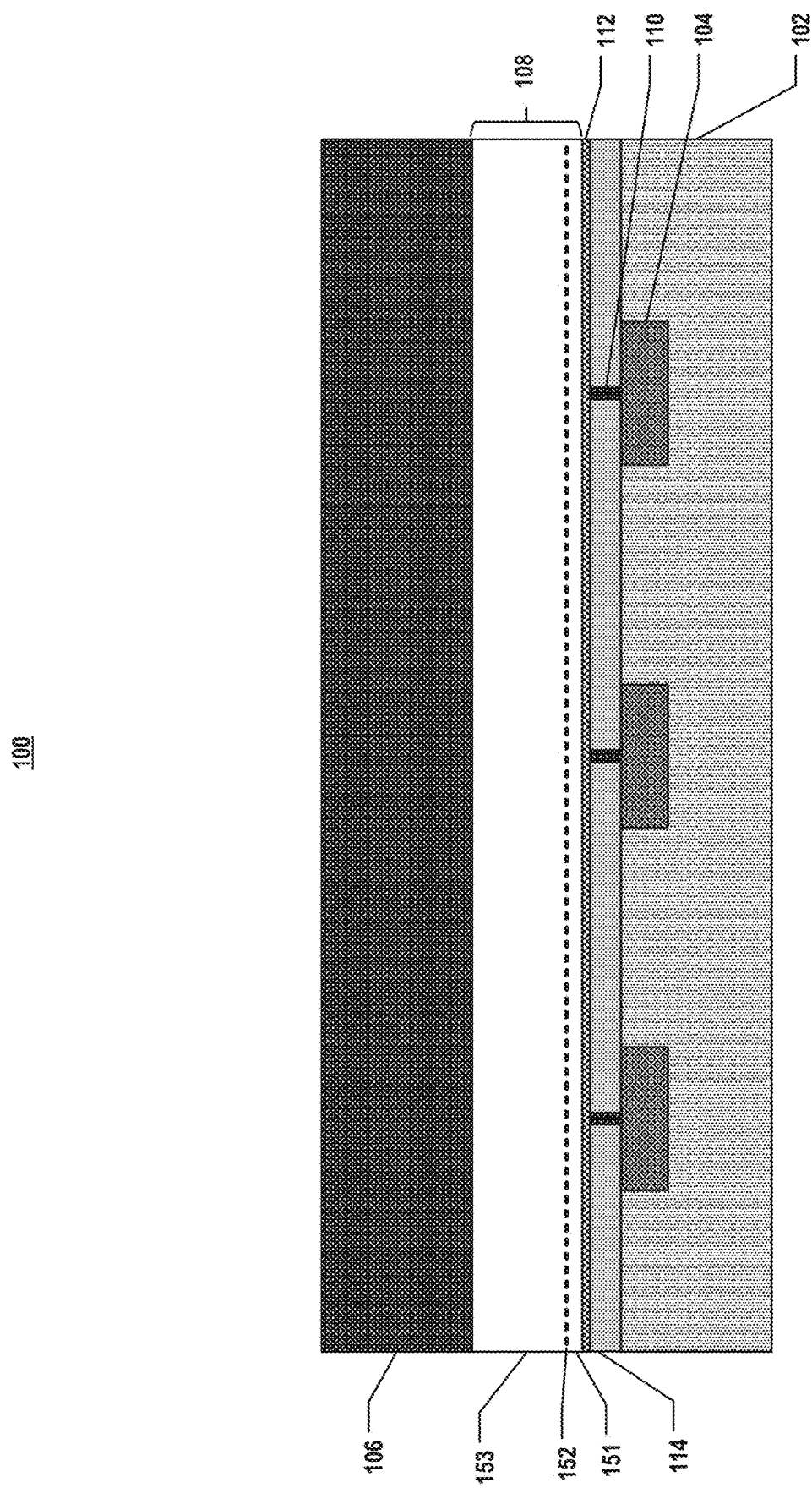

FIGS. 3A-3B illustrate cross sections of LED structure 100 when operation 408 is performed using alternative operations, according to some implementations of the present disclosure. The operations shown in FIGS. 3A-3B may replace the operations shown in FIGS. 2C-2D. As shown in FIG. 3A, after operation 406 is performed to deposit bonding layer 114 over first substrate 102, the plurality of contact pads 104, and the plurality of metal contacts 110, bonding layer 114 is deposited on the top of each metal contact 110. Then a photolithography process and an etch process may be used to remove bonding layer 114 deposited on the top of each metal contact 110 and expose the top of each metal contact 110, as shown in FIG. 3A.

As shown in FIG. 3B, second substrate 106, including semiconductor layer 108 and ohmic contact layer 112, is flipped over and placed on bonding layer 114. Because the top of each metal contact 110 is exposed, metal contacts 110 may electrically contact ohmic contact layer 112.

Figure 2E:
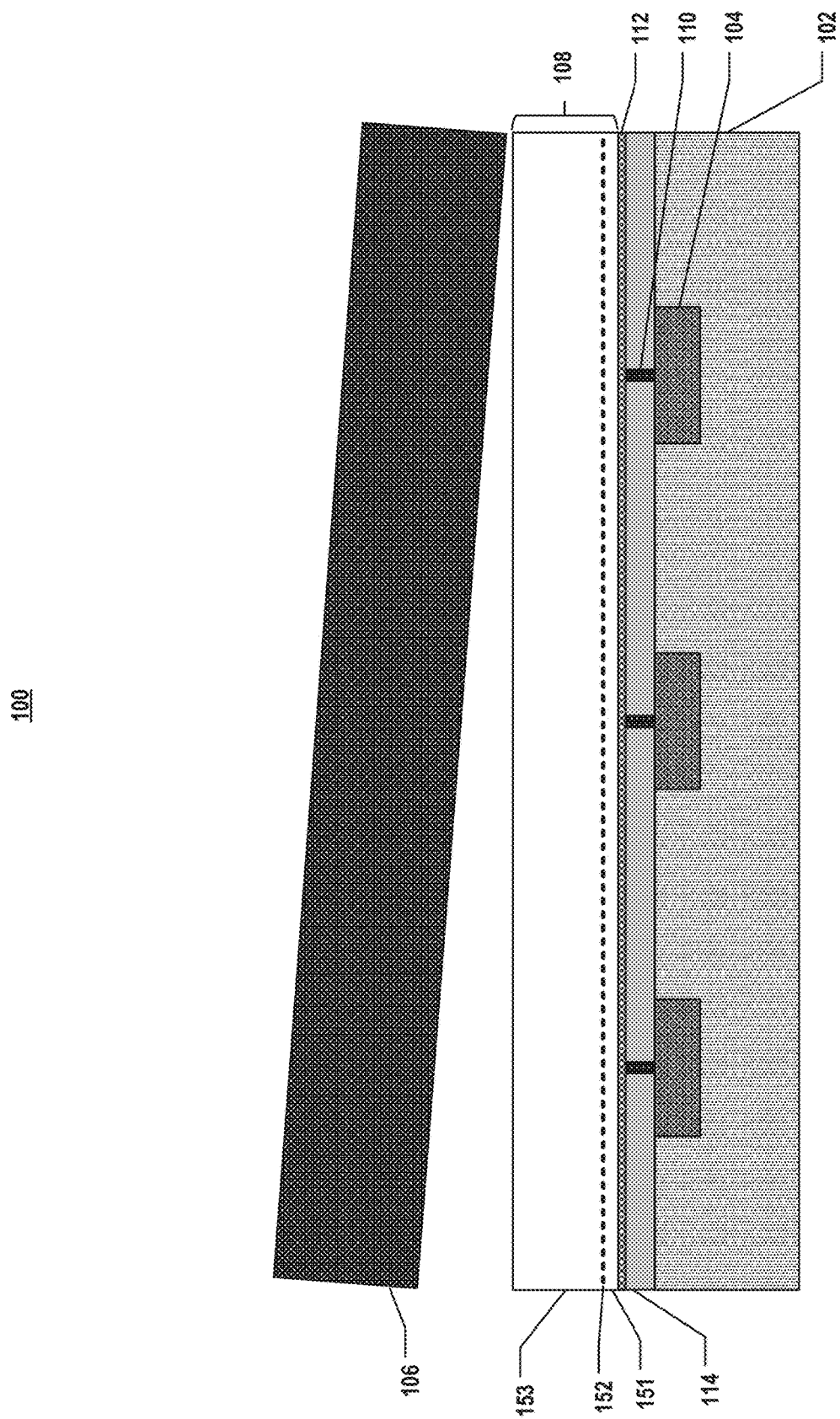

As shown in FIG. 2E, after bonding second substrate 106, semiconductor layer 108 and ohmic contact layer 112 to bonding layer 114 on first substrate 102, second substrate 106 may be removed from semiconductor layer 108. FIG. 2E shows bonding layer 114 between first substrate 102 and ohmic contact layer 112. However, in some implementations, bonding layer 114 may include one or multiple layers to bond first substrate 102 and ohmic contact layer 112. For example, bonding layer 114 may include a single nonconductive layer. For another example, bonding layer 114 may include multiple nonconductive layers, or an adhesive material and a nonconductive layer.

After removing second substrate 106, in some implementations, a thinning operation may be optionally performed on second doping type semiconductor layer 153 to remove a portion of second doping type semiconductor layer 153. In some implementations, the thinning operation may include a dry etching or a wet etching operation. In some implementations, the thinning operation may include a chemical-mechanical polishing (CMP) operation. In some implementations, after the thinning operation, the thickness including first doping type semiconductor layer 151, MQW layer 152 and second doping type semiconductor layer 153 may be between about 0.3 μm and about 5 μm. In some other implementations, after the thinning operation, the thickness including first doping type semiconductor layer 151, MQW layer 152 and second doping type semiconductor layer 153 may be between about 0.4 μm and about 4 μm. In some alternative implementations, after the thinning operation, the thickness including first doping type semiconductor layer 151, MQW layer 152 and second doping type semiconductor layer 153 may be between about 0.5 μm and about 3 μm.

Figure 2G:
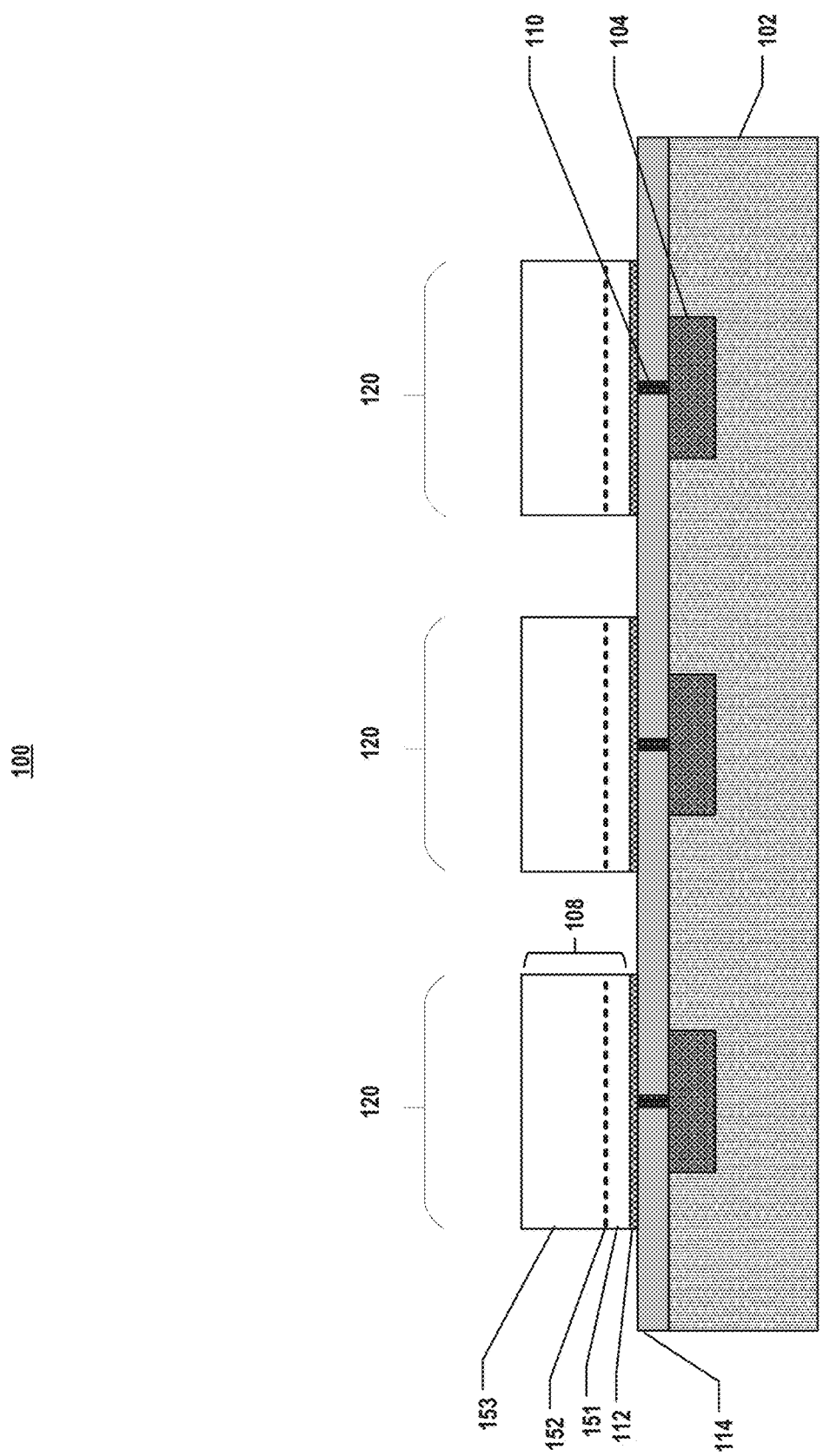

Referring to FIG. 2F, a first etch operation is performed to remove a portion of semiconductor layer 108, including first doping type semiconductor layer 151, MQW layer 152 and second doping type semiconductor layer 153, to form a plurality of LED mesas. In some implementations, the first etch operation may include dry etch, wet etch, or other suitable process. Referring to FIG. 2G, a second etch operation is performed to remove a portion of ohmic contact layer 112 to form a plurality of LED units 120. In some implementations, the second etch operation may include dry etch, wet etch, or other suitable process.

Figure 2H:
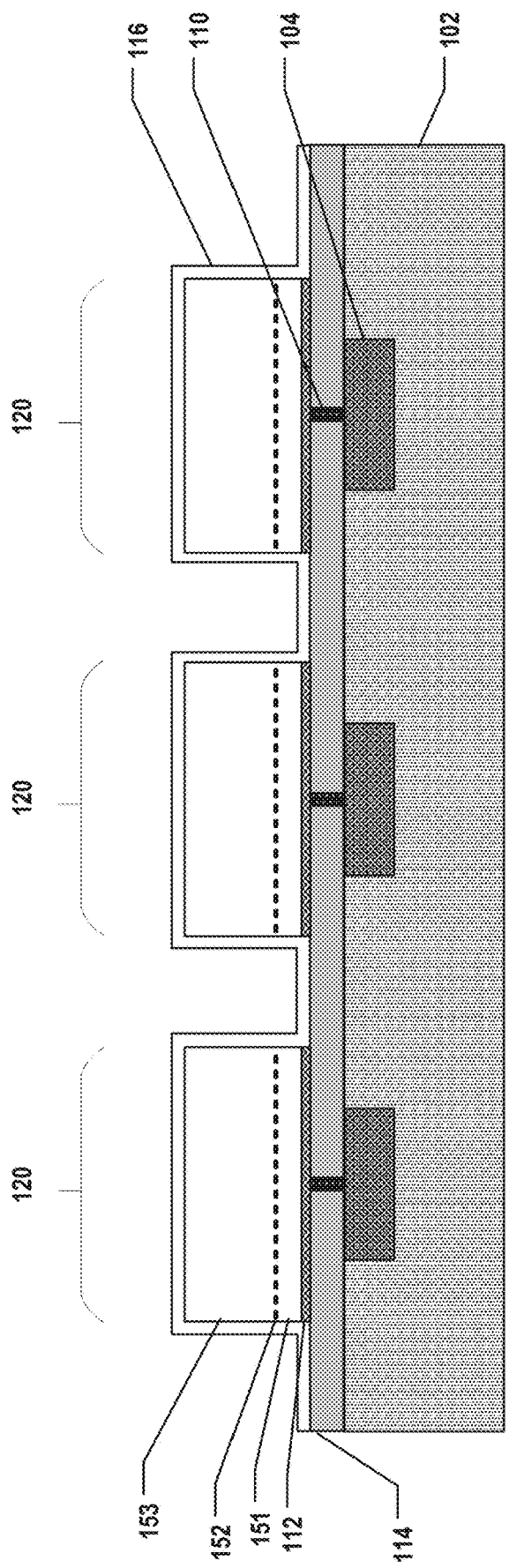

Referring to FIG. 2H, a passivation layer 116 is formed on semiconductor layer 108 covering first doping type semiconductor layer 151, MQW layer 152, second doping type semiconductor layer 153, ohmic contact layer 112, and bonding layer 114. In some implementations, passivation layer 116 may include $SiO_2$, $Al_2O_3$, SiN or other suitable materials for isolation and protection. In some implementations, passivation layer 116 may include polyimide, SU-8 photoresist, or other photo-patternable polymer. In FIG. 2H, passivation layer 116 of adjacent LED units 120 is connected. However, it is understood that passivation layer 116 of adjacent LED units 120 may alternatively be separated.

Figure 2I:
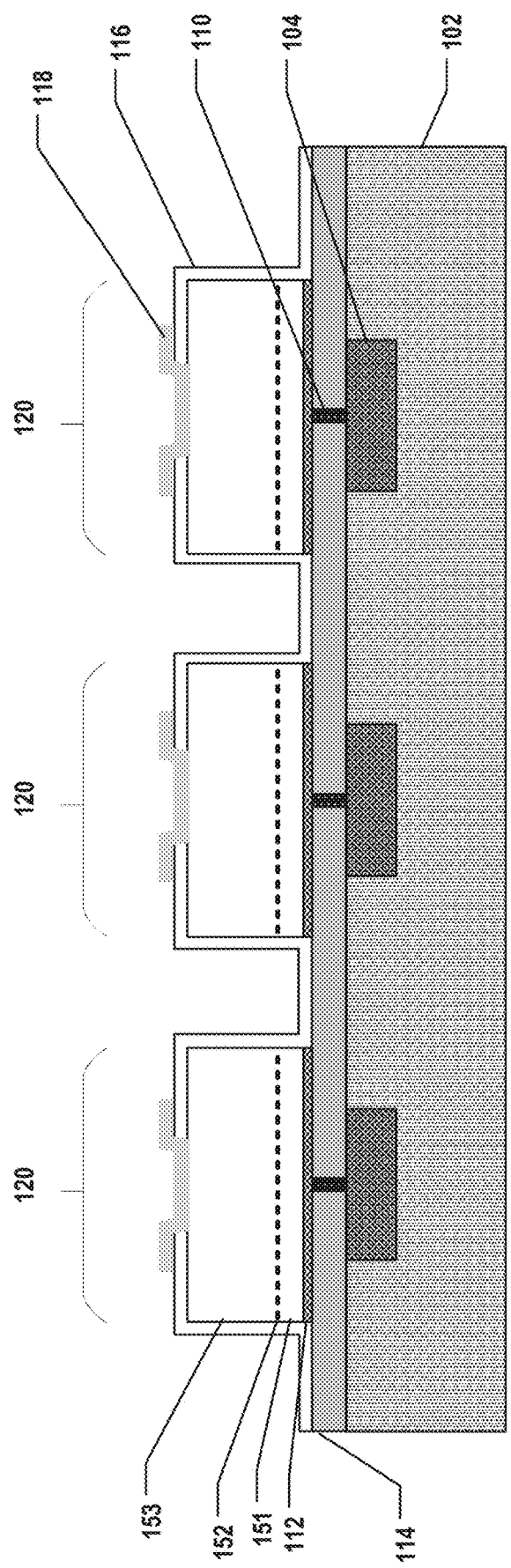

As shown in FIG. 2I, after forming passivation layer 116, a plurality of openings are formed on passivation layer 116 to expose second doping type semiconductor layer 153 of each LED unit 120. Then, an electrode layer 118 is formed on passivation layer 116 covering each opening on each LED unit 120. Electrode layer 118 electrically contacts second doping type semiconductor layer 153 of each LED unit 120 to form an electrical path to connect the LED unit with the driving circuit. In some implementations, electrode layer 118 may include conductive materials, such as indium tin oxide (ITO), Cr, Ti, Pt, Au, Al, Cu, Ge or Ni. Electrode layer 118 of the plurality of LED units 120 may be electrically connected to the same constant voltage source, and the plurality of LED units 120 share a common cathode.

The present disclosure provides a LED structure and a method for manufacturing the LED structure in which the bonding layer, or the adhesive material, used to bond the epitaxy layer on the receiving substrate is a nonconductive material. The nonconductive adhesive layer is embedded with a metal contact therein to electrically connect the epitaxy layer (including the LED units) with the driving circuit in the receiving substrate. By using nonconductive material for the bonding with only small metal contacts embedded therein, the metal material used to bond the epitaxy layer on the receiving substrate is drastically reduced compared to conventional designs, and therefore the manufacturing cost is lowered. In addition, by using the nonconductive adhesive layer to bond the epitaxy layer on the receiving substrate, the thermal process for conductive adhesive materials is not needed, and therefore the internal stress caused by the thermal mismatch between the epitaxy layer and the receiving substrate could be also reduced.

According to one aspect of the present disclosure, a LED structure is disclosed. The LED structure includes a substrate, a plurality of LED units, a bonding layer and a metal contact. The substrate includes a driving circuit, and a plurality of LED units is formed on the substrate. The bonding layer is formed between the substrate and the plurality of LED units, and the metal contact is formed in the bonding layer beneath each LED unit to electrically connect each LED unit with a contact pad of the driving circuit. A first sectional area of the metal contact is smaller than a second sectional area of each LED unit.

In some implementations, each LED unit includes a first doping type semiconductor layer formed on the bonding layer, a multiple quantum well (MQW) layer formed on the first doping type semiconductor layer, and a second doping type semiconductor layer formed on the MQW layer. In some implementations, each LED unit further includes an ohmic contact layer formed between the first doping type semiconductor layer and the bonding layer. The first sectional area of the metal contact is smaller than a fourth sectional area of ohmic contact layer. In some implementations, an anode of each LED unit directly contacts the ohmic contact layer.

In some implementations, the size of the metal contact is designed to be sufficiently small. For example, a diameter of the first sectional area of the metal contact is less than about 1 micrometer. As another example, the metal contact has a thickness less than about 1 micrometer. In some implementations, the plurality of LED units includes a first LED unit and a second LED unit adjacent to the first LED unit. The bonding layer of the first LED unit horizontally extends to the bonding layer of the second LED unit adjacent to the first LED unit. In some implementations, the plurality of LED units share a common cathode.

According to another aspect of the present disclosure, a LED structure is disclosed. The LED structure includes a substrate, a plurality of LED units and a nonconductive adhesive layer. The substrate includes a driving circuit, and a plurality of LED units is formed on the substrate. The nonconductive adhesive layer bonds the substrate and the plurality of LED units. The nonconductive adhesive layer is embedded with a metal contact therein, and the metal contact and a portion of the nonconductive adhesive layer are integrally formed beneath each LED unit.

In some implementations, the nonconductive adhesive layer is formed by polyimide (PI), polydimethylsiloxane (PDMS), SU-8 photoresist or polymethylglutarimide (PMGI). In some implementations, the metal contact electrically connects each LED unit with a contact pad of the driving circuit.

In some implementations, each LED unit includes an ohmic contact layer formed on the metal contact and the portion of the nonconductive adhesive layer, and the metal contact electrically connects the ohmic contact layer with the contact pad of the driving circuit. In some implementations, an anode of each LED unit directly contacts the ohmic contact layer.

According to a further aspect of the present disclosure, a method for manufacturing a LED structure is disclosed. A driving circuit having a plurality of contact pads is formed in a first substrate. A plurality of metal contacts are formed on the first substrate, and each metal contact is located on one of the plurality of contact pads. A nonconductive adhesive layer is formed on the first substrate covering the plurality of contact pads and the plurality of metal contacts. A plurality of LED units are formed on the nonconductive adhesive layer. Each LED unit is electrically connected to one of the plurality of contact pads through one of the plurality of metal contacts.

In some implementations, a semiconductor layer is formed on a second substrate, the second substrate is flipped over to place the semiconductor layer on the nonconductive adhesive layer, the first substrate and the second substrate are pressed against each other to bond the semiconductor layer with the nonconductive adhesive layer, and the second substrate is removed.

In some implementations, a portion of the nonconductive adhesive layer above the plurality of metal contacts is extruded to electrically connect the semiconductor layer with the plurality of metal contacts. In some implementations, after forming the semiconductor layer on the second substrate, an ohmic contact layer is formed on the semiconductor layer.

In some implementations, after removing the second substrate, a first etch operation is performed to remove a portion of the semiconductor layer to form the plurality of LED units. In some implementations, a second etch operation is performed to remove a portion of the ohmic contact layer between each LED unit.

In some implementations, after forming the nonconductive adhesive layer on the first substrate covering the plurality of contact pads and the plurality of metal contacts, a portion of the nonconductive adhesive layer above the plurality of metal contacts is removed to expose the plurality of metal contacts.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A light emitting diode (LED) structure, comprising:
a substrate comprising a driving circuit;
a plurality of LED units formed on the substrate;
a bonding layer formed between the substrate and the plurality of LED units; and
a metal column formed in the bonding layer beneath each LED unit to electrically connect each LED unit with a contact pad of the driving circuit,
wherein a first sectional area of the metal column is smaller than a second sectional area of each LED unit, and
a thickness of the bonding layer is equal to a thickness of the metal column, and only a bottom surface of each LED unit is in contact with the bonding layer.

2. The LED structure of claim 1, wherein each LED unit comprises:
a first doping type semiconductor layer formed on the bonding layer;
a multiple quantum well (MQW) layer formed on the first doping type semiconductor layer; and
a second doping type semiconductor layer formed on the MQW layer.

3. The LED structure of claim 2, wherein each LED unit further comprises an ohmic contact layer formed between the first doping type semiconductor layer and the bonding layer,
wherein the first sectional area of the metal contact column is smaller than a sectional area of ohmic contact layer.

4. The LED structure of claim 3, wherein an anode of each LED unit directly contacts the ohmic contact layer.

5. The LED structure of claim 1, wherein a diameter of the first sectional area of the metal column is less than about 1 micrometer.

6. The LED structure of claim 1, wherein the metal column has a thickness less than about 1 micrometer.

7. The LED structure of claim 1, wherein the plurality of LED units comprise a first LED unit and a second LED unit adjacent to the first LED unit, wherein the bonding layer of the first LED unit horizontally extends to the bonding layer of the second LED unit adjacent to the first LED unit.

8. The LED structure of claim 1, wherein the plurality of LED units share a common cathode.

9. A lighting diode (LED) structure, comprising:
a substrate comprising a driving circuit;
a plurality of LED units formed on the substrate; and
a nonconductive adhesive layer bonding the substrate and the plurality of LED units;
wherein the nonconductive adhesive layer is embedded with a metal column therein, and the metal column and a portion of the nonconductive adhesive layer are integrally formed beneath each LED unit, and
a thickness of the nonconductive adhesive layer is equal to a thickness of the metal column, and only a bottom surface of each LED unit is in contact with the nonconductive adhesive layer.

10. The LED structure of claim 9, wherein the nonconductive adhesive layer is formed by polyimide (PI), polydimethylsiloxane (PDMS), SU-8 photoresist or polymethylglutarimide (PMGI).

11. The LED structure of claim 9, wherein the metal column electrically connects each LED unit with a contact pad of the driving circuit.

12. The LED structure of claim 11, wherein each LED unit comprises an ohmic contact layer formed on the metal column and the portion of the nonconductive adhesive layer, and the metal column electrically connects the ohmic contact layer with the contact pad of the driving circuit.

13. The LED structure of claim 12, wherein an anode of each LED unit directly contacts the ohmic contact layer.

14. The LED structure of claim 1, further comprising:
a passivation layer formed on the plurality of LED units and covering surfaces of the LED units except the bottom surfaces of the LED units;
a plurality of openings formed on the passivation layer to expose a top surface of each LED unit; and
an electrode layer formed on the passivation layer covering each opening on each LED unit.

15. The LED structure of claim 9, further comprising:
a passivation layer formed on the plurality of LED units and covering surfaces of the LED units except the bottom surfaces of the LED units;
a plurality of openings formed on the passivation layer to expose a top surface of each LED unit; and
an electrode layer formed on the passivation layer covering each opening on each LED unit.

* * * * *